US011495273B2

(12) United States Patent
Roehr et al.

(10) Patent No.: US 11,495,273 B2
(45) Date of Patent: Nov. 8, 2022

(54) WRITE CIRCUIT, NON-VOLATILE DATA STORAGE, METHOD FOR WRITING TO A PLURALITY OF MEMORY CELLS AND METHOD FOR OPERATING A NON-VOLATILE DATA MEMORY

(71) Applicant: Infineon Technologies AG, Neubiberg (DE)

(72) Inventors: Thomas Roehr, Puchheim (DE); Volker Pissors, Radeburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/188,164

(22) Filed: Mar. 1, 2021

(65) Prior Publication Data

US 2021/0272610 A1 Sep. 2, 2021

(30) Foreign Application Priority Data

Mar. 2, 2020 (DE) .................. 10 2020 105 500.5

(51) Int. Cl.
*G11C 7/00* (2006.01)
*G11C 7/10* (2006.01)
*G11C 7/06* (2006.01)

(52) U.S. Cl.
CPC .............. *G11C 7/1096* (2013.01); *G11C 7/06* (2013.01); *G11C 7/1087* (2013.01)

(58) Field of Classification Search
CPC .................................................. G11C 7/1096

USPC ....................................................... 365/189.16
See application file for complete search history.

(56) References Cited

U.S. PATENT DOCUMENTS

| 8,832,508 | B2* | 9/2014 | Henrion | ............... | G11C 7/1069 |
| | | | | | 714/719 |
| 2004/0085485 | A1 | 5/2004 | Ooishi | | |
| 2008/0089146 | A1* | 4/2008 | Fujito | ...................... | G11C 7/04 |
| | | | | | 365/190 |

* cited by examiner

*Primary Examiner* — Hoai V Ho
(74) *Attorney, Agent, or Firm* — Eschweiler & Potashnik, LLC

(57) ABSTRACT

A write circuit for writing to a plurality of memory cells of a non-volatile data memory, including a buffer memory forming a single memory element which is configured to buffer a first data value before storing said value in the plurality of non-volatile memory cells of the non-volatile data memory. The write circuit also includes a first write line, by means of which the buffer memory is connected to a first memory cell of the plurality of memory cells, and a second write line, which is different from the first write line and by means of which the buffer memory is connected to a second memory cell of the plurality of memory cells. The write circuit further includes a control circuit configured to concurrently write the first data value in the first memory cell and a second data value which depends on the first data value into the second memory cell, wherein the second data value is complementary to the first data value or is identical to the first data value depending on a selected one of a first option or a second option by the control circuit, respectively.

13 Claims, 10 Drawing Sheets

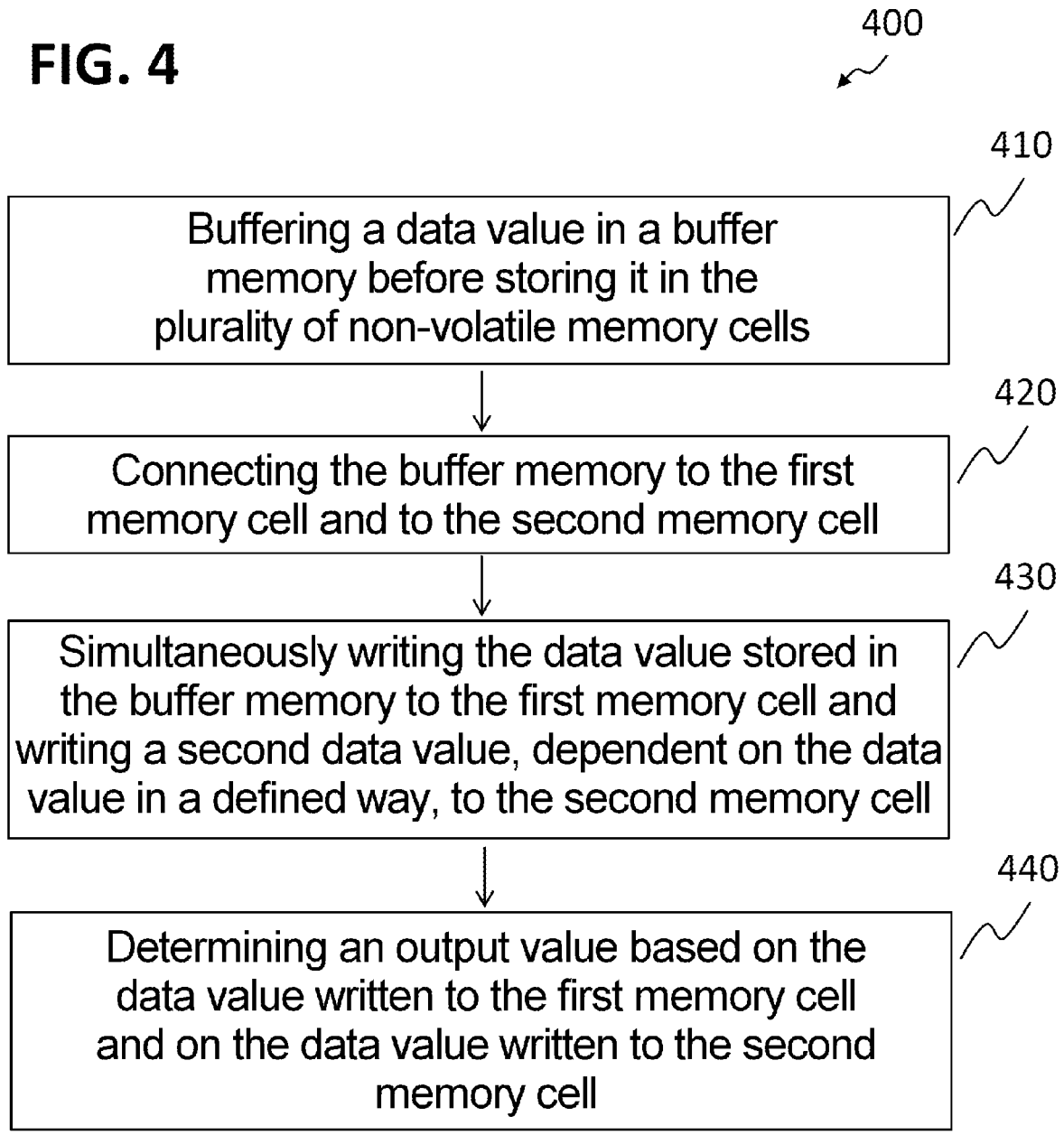

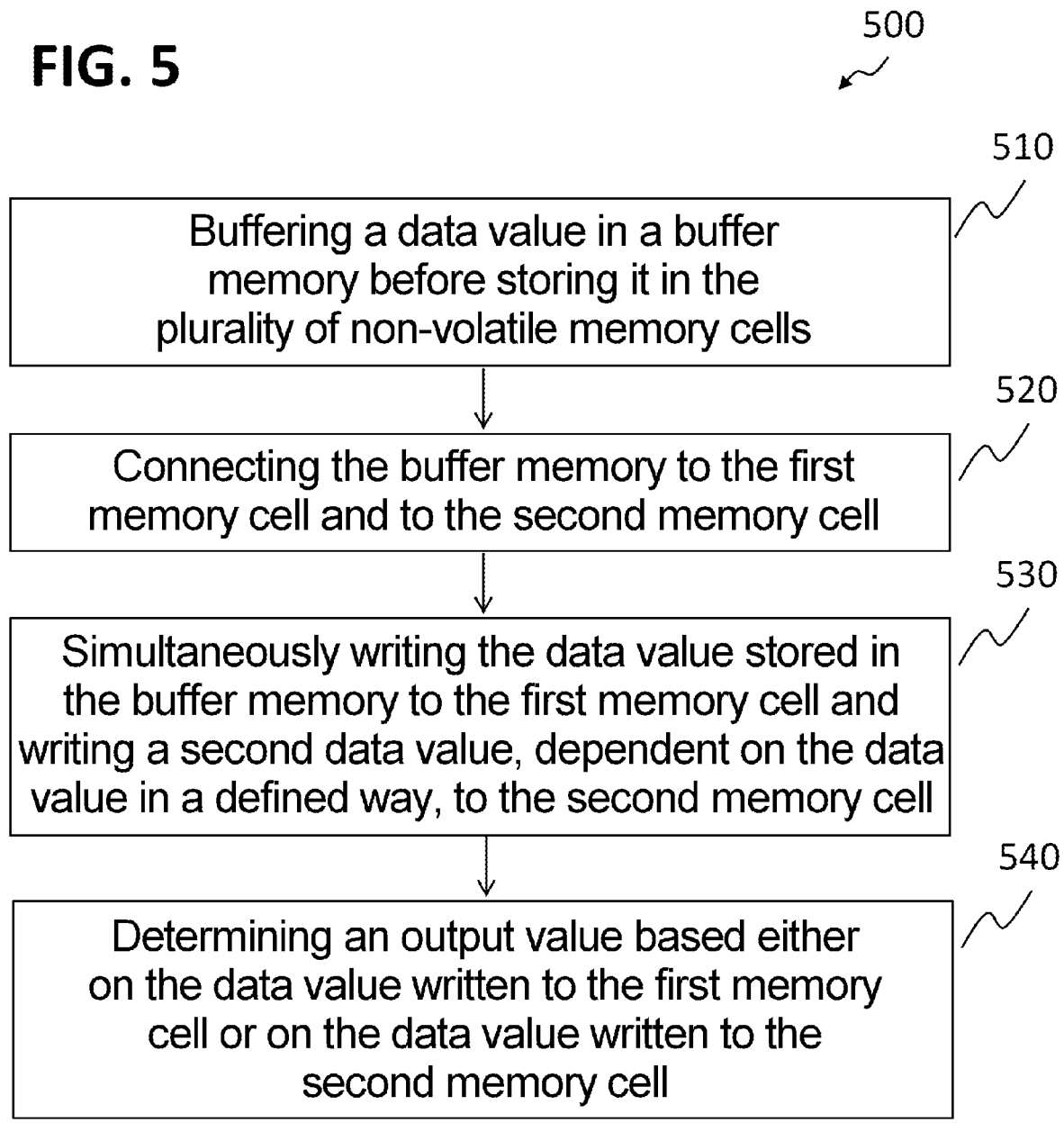

WRITE CIRCUIT, NON-VOLATILE DATA STORAGE, METHOD FOR WRITING TO A PLURALITY OF MEMORY CELLS AND METHOD FOR OPERATING A NON-VOLATILE DATA MEMORY

REFERENCE TO RELATED APPLICATION

This application claims priority to German Application No. 10 2020 105 500.5, filed on Mar. 2, 2020, the contents of which are hereby incorporated by reference in their entirety.

FIELD

The disclosure relates to a write circuit, a non-volatile data memory, a method for writing to a plurality of memory cells, and a method for operating a non-volatile data memory.

BACKGROUND

When writing to a non-volatile semiconductor memory (in short: memory), e.g. Flash, MRAM, RRAM, PCRAM, etc., (which can also be referred to as programming the memory), the write speed is a critical parameter in order to gain an advantage over the competition, for example from a user's point of view. In addition, the write speed greatly influences the test duration and thus the test costs when testing the components.

FIGS. 1A and 1C each show a schematic representation of a write circuit 100 according to the prior art.

In the write circuit 100, data that is fed to buffer memory 102, 102a, 102b, 102c (also referred to as a write buffer) by means of an input line 114 is fed either to a first memory cell (not shown) by means of connecting lines 106, 108_1 and 110_1, or to a second memory cell (not shown) by means of connecting lines 106, 108_2 and 110_2. The memory cell to be written can be selected via switches 112_1 and 112_2.

A common method for increasing the write speed is to increase the parallelism of the writing operation, i.e. to increase the data word width used for writing. However, this requires correspondingly more lead connections in order to transfer the data from, e.g., a microcontroller to the semiconductor memory. In addition, the method requires more buffer memories 102 which can buffer the data to be written during the actual write operation.

FIG. 1B shows a schematic representation of a non-volatile data memory 101 according to the prior art, which has a plurality of such buffer memories 102 and more connection lines 110. In FIG. 1B each write circuit is configured to write to only a single memory cell 116.

Of course, these additional lines 110 and buffer memory 102 require additional space and thus increase the surface area of the semiconductor memory 101, which increases the production costs.

Patent publication US 2008/089 146 A1 discloses a semiconductor device containing a non-volatile memory with a memory array containing 1-bit twin cells, each consisting of electrically rewritable first and second storage devices, with the first and second storage device holding binary data according to the difference in their threshold voltages.

US 2004/085 845 A1 discloses a semiconductor device which is configured to detect a leakage current. To achieve this, in a test mode a supply of power to a power supply node is stopped by means of a circuit breaker and an externally adjustable test current is fed to the power supply node.

SUMMARY

In various exemplary embodiments, a write circuit is provided which simultaneously or concurrently programs the contents of the buffer memory into two memory cells, without the need to increase the number of data lines or the number of buffer memories. In one embodiment a distinction is made here between two use cases:

In the first use case, complementary data items are written to the two memory cells. For example, if a logical "1" is written to the first memory cell, a logical "0" is written to the second memory cell, and vice versa. A corresponding write operation can also be referred to as differential writing and the corresponding read operation as differential reading.

In the second use case, the same data item is written to the two memory cells. For example, if a logical "1" is written to the first memory cell, a logical "1" is also written to the second memory cell. If a logical "0" is written to the first memory cell, a logical "0" is also written to the second memory cell. With this method, it is possible to write the same data pattern to two memory areas in half the time. The write width is thus increased from a value of e.g. 280 bits in current microcontrollers to e.g. 560 bits, without the need for a wider interface between e.g. memory controller and non-volatile (e.g. Flash) memory. The write throughput is doubled. This can be particularly advantageous when testing the memory areas and shortens the testing time accordingly.

In various exemplary embodiments, a write circuit or a corresponding method is provided for writing to a plurality of memory cells of a non-volatile data memory, which programs the contents of the buffer memories into two memory cells at the same time, wherein the data values written to the two memory cells have a defined dependency on each other. For example, the data values can be complementary, or the data values can be the same.

Writing the complementary data values to the two memory cells can be used in different exemplary embodiments, e.g. during user operation.

In various exemplary embodiments the writing of the identical data values to the two memory cells can be used in a memory or writing method that compares a memory value of a single cell with a reference value in order to read out the data values, for example during a test operating mode. For the user operating mode, the memory can be equipped with a switch, which allows only one of the two cells at a time to be selected for programming.

BRIEF DESCRIPTION OF THE DRAWINGS

In the drawings, similar reference signs usually refer to the same parts in all different views, although for reasons of clarity the assignment of reference signs to all of the parts corresponding to each other in all figures is sometimes omitted. Parts of the same or similar types may also be distinguished by assigning them a common reference sign with an appended number or appended letter. The drawings are not necessarily intended to be reproduced true-to-scale, the emphasis instead being given to illustrating the principles of the invention. The following description describes various embodiments of the invention with reference to the following drawings, in which.

DETAILED DESCRIPTION

The following detailed description refers to the accompanying drawings, which use illustration to show an example of specific details and designs in which the invention can be implemented in practice.

The word "exemplary" is used here in the meaning of "serving as an example, exemplar or illustration". All embodiments or configurations described herein as "exemplary" are not necessarily to be interpreted as preferred or advantageous compared to other embodiments or configurations.

In different exemplary embodiments, a write circuit and a method for writing to a non-volatile semiconductor memory are provided, in which the data stored in a write buffer is simultaneously programmed into two memory cells so that the writing efficiency is doubled or the required writing time is halved. The programmed data items can be complementary to each other (e.g. for differential memories) or they can be identical (e.g. for test modes).

Figure 1A:
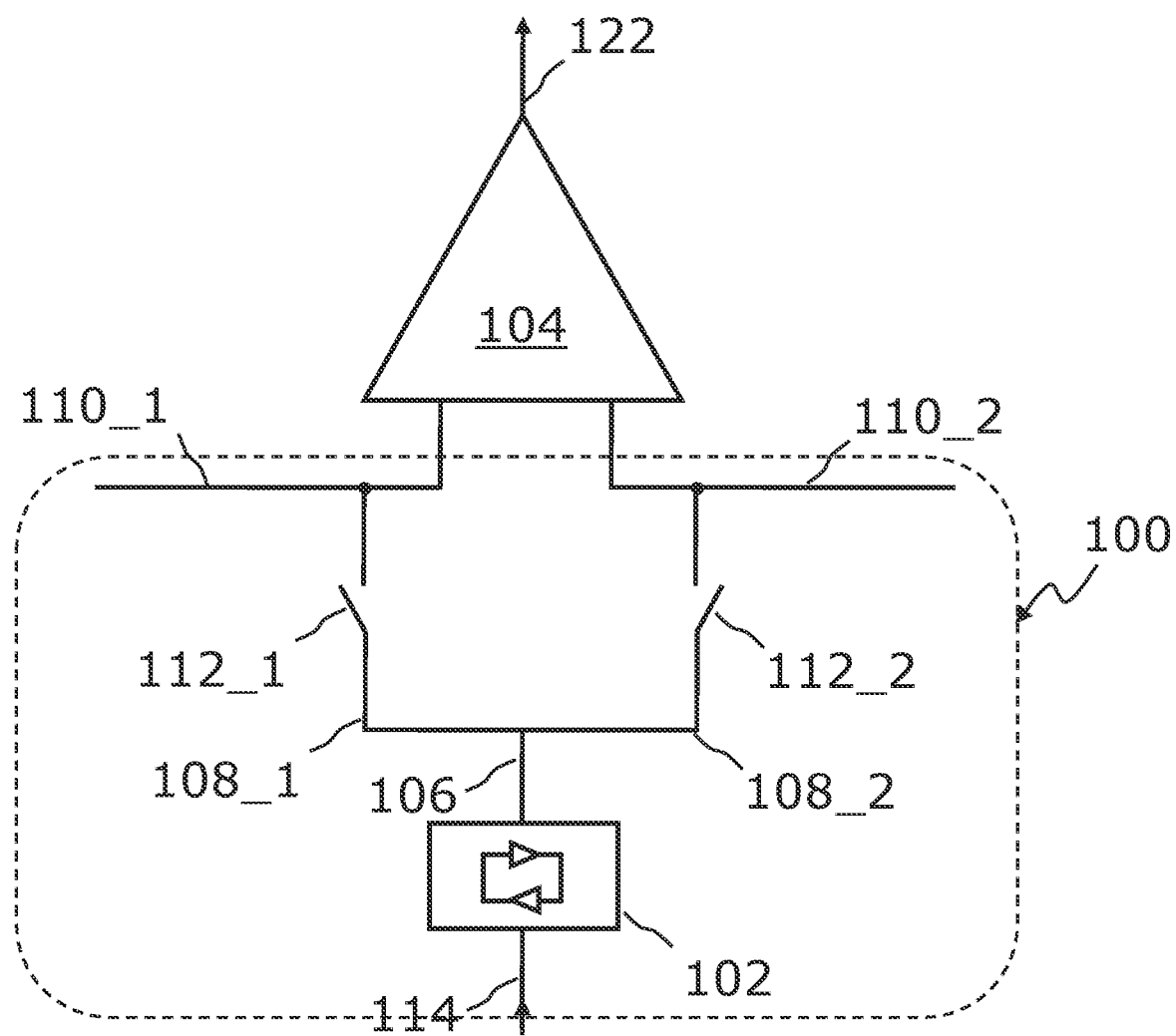
FIG. 1A shows a schematic representation of a write circuit according to the prior art.
Figure 1B:
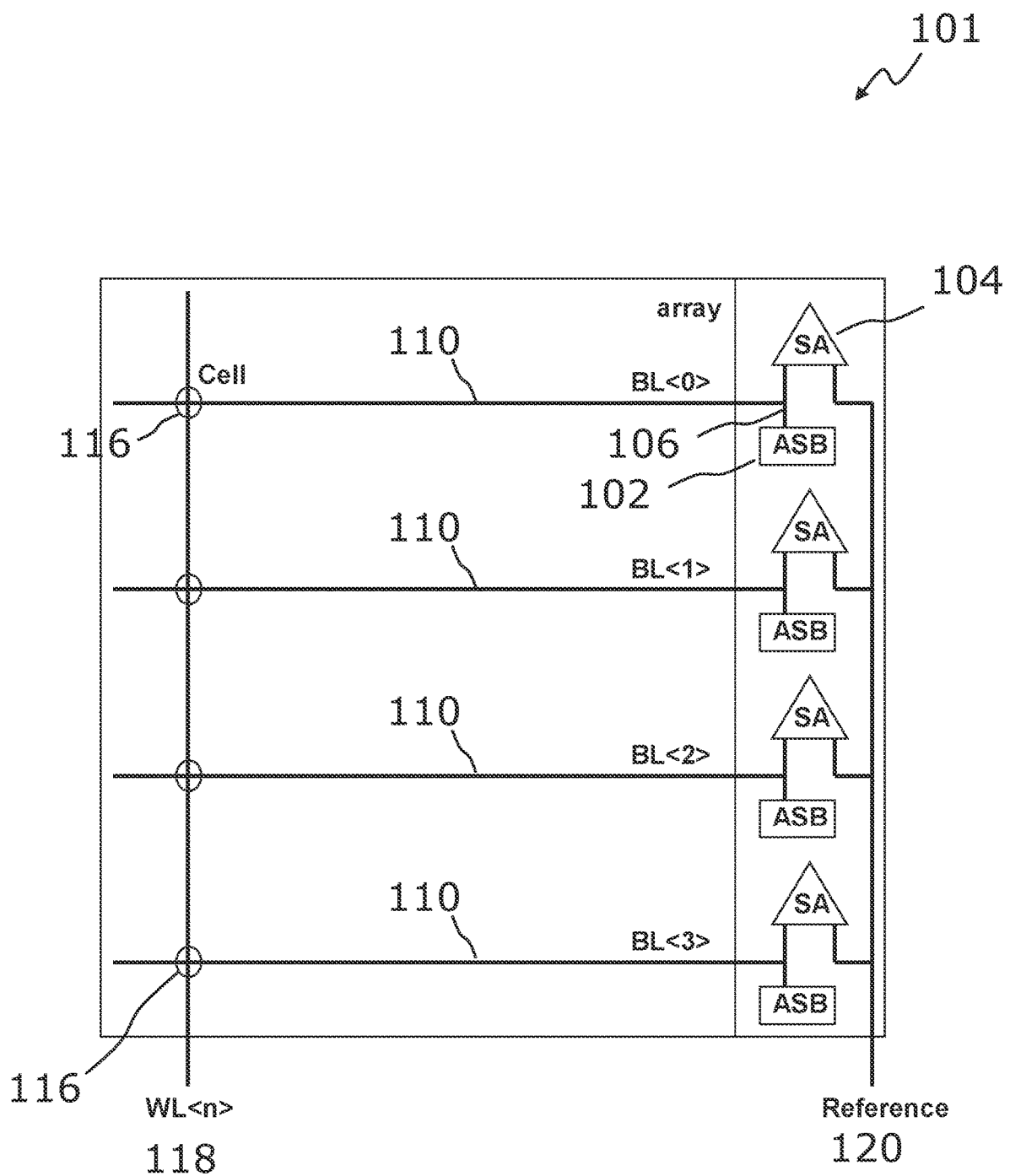
FIG. 1B shows a schematic representation of a non-volatile data memory according to the prior art.
Figure 1C:
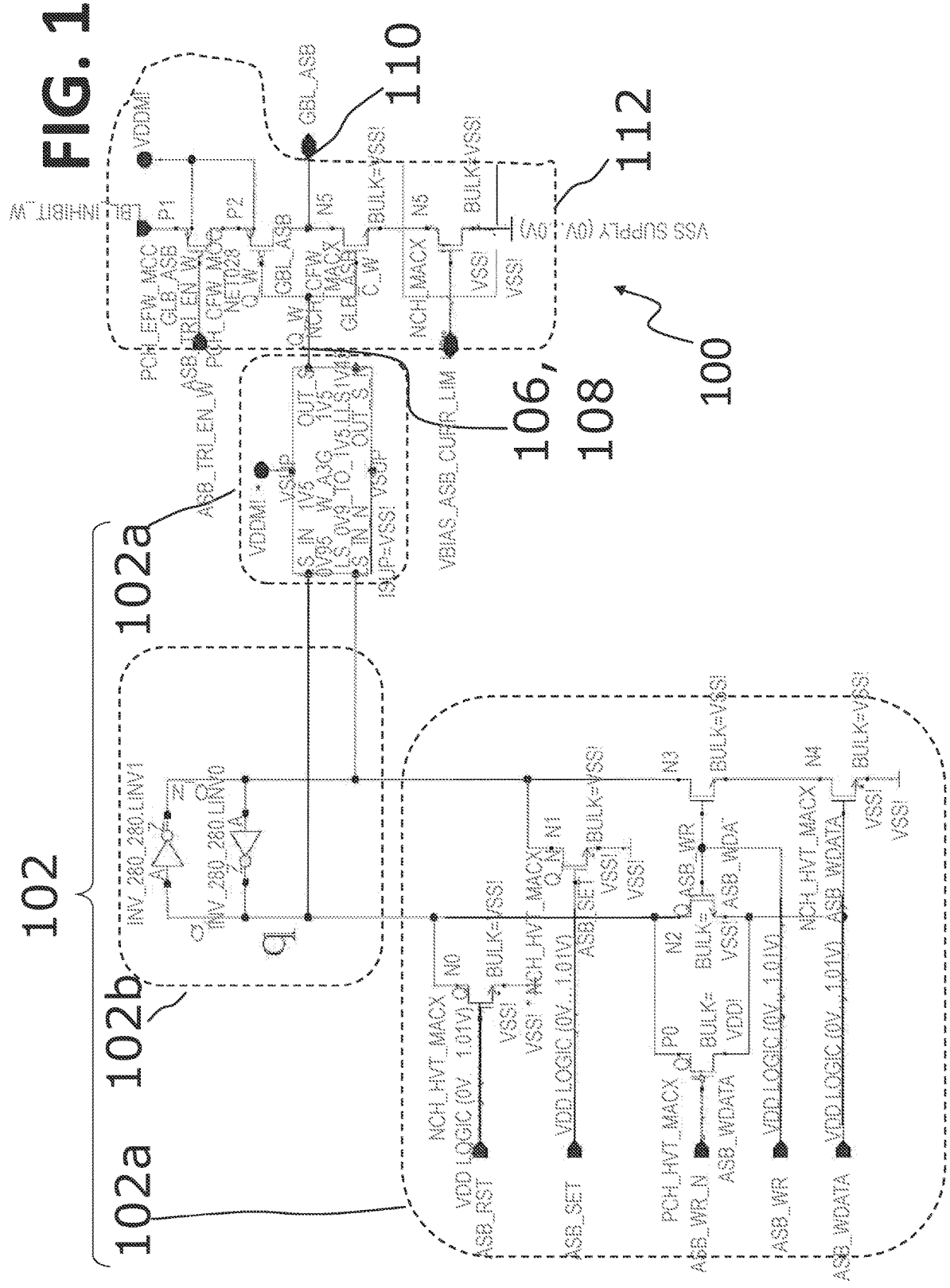
FIG. 1C shows a schematic representation of a write circuit according to the prior art.
Figure 2A:
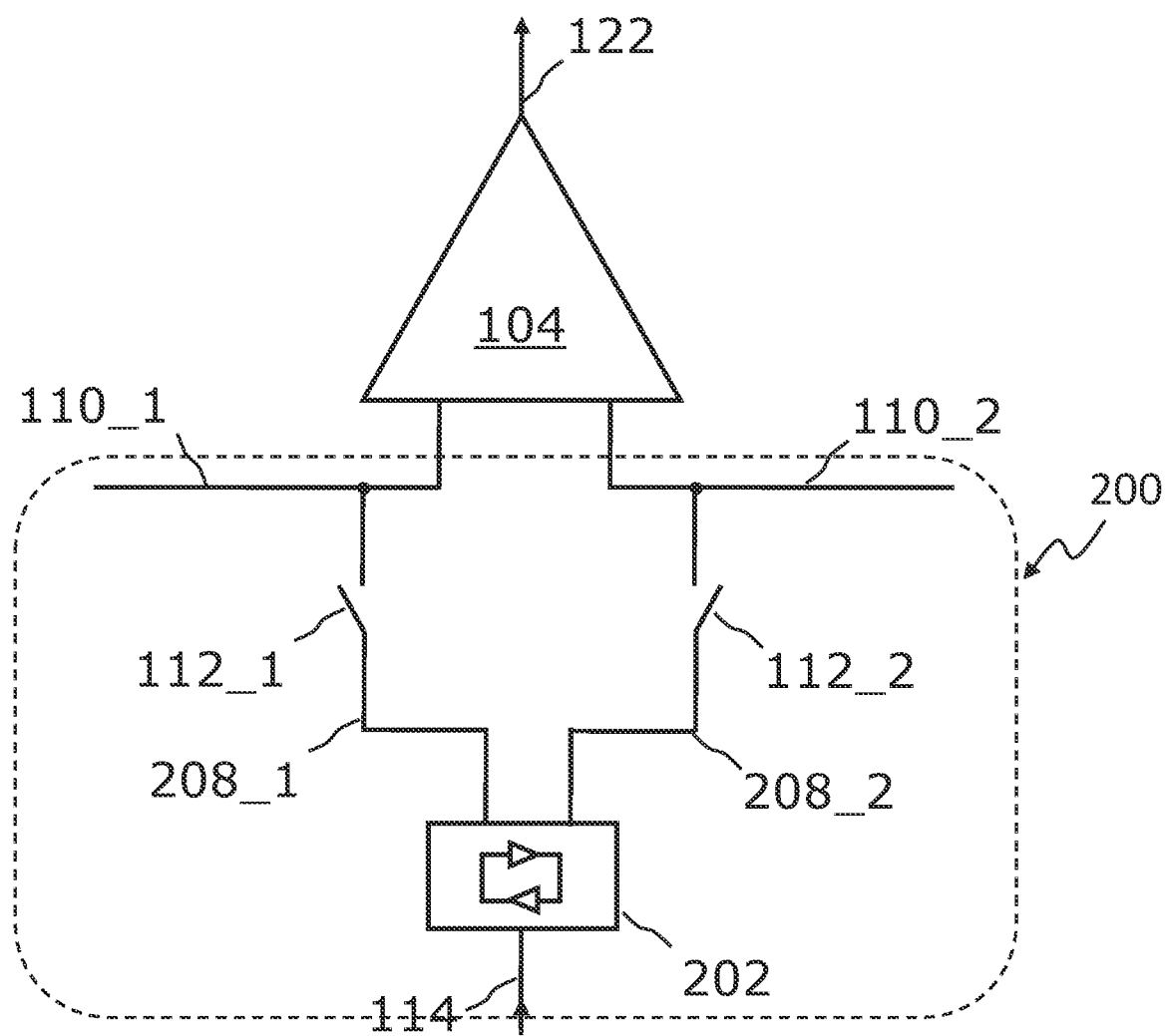
FIG. 2A shows a schematic representation of a write circuit according to various exemplary embodiments.
Figure 2B:
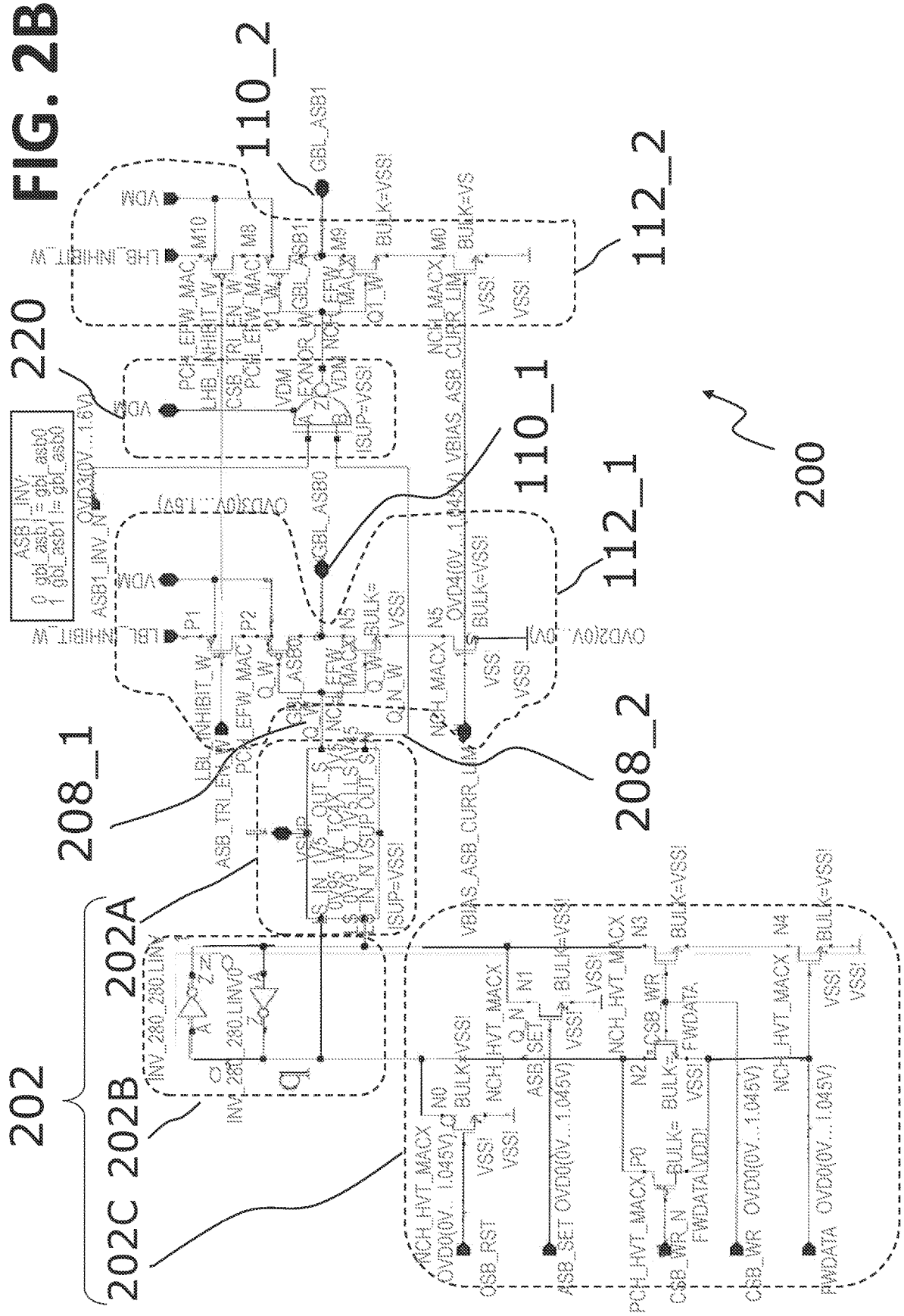
FIG. 2B shows a schematic representation of a write circuit according to various exemplary embodiments.
Figure 2C:
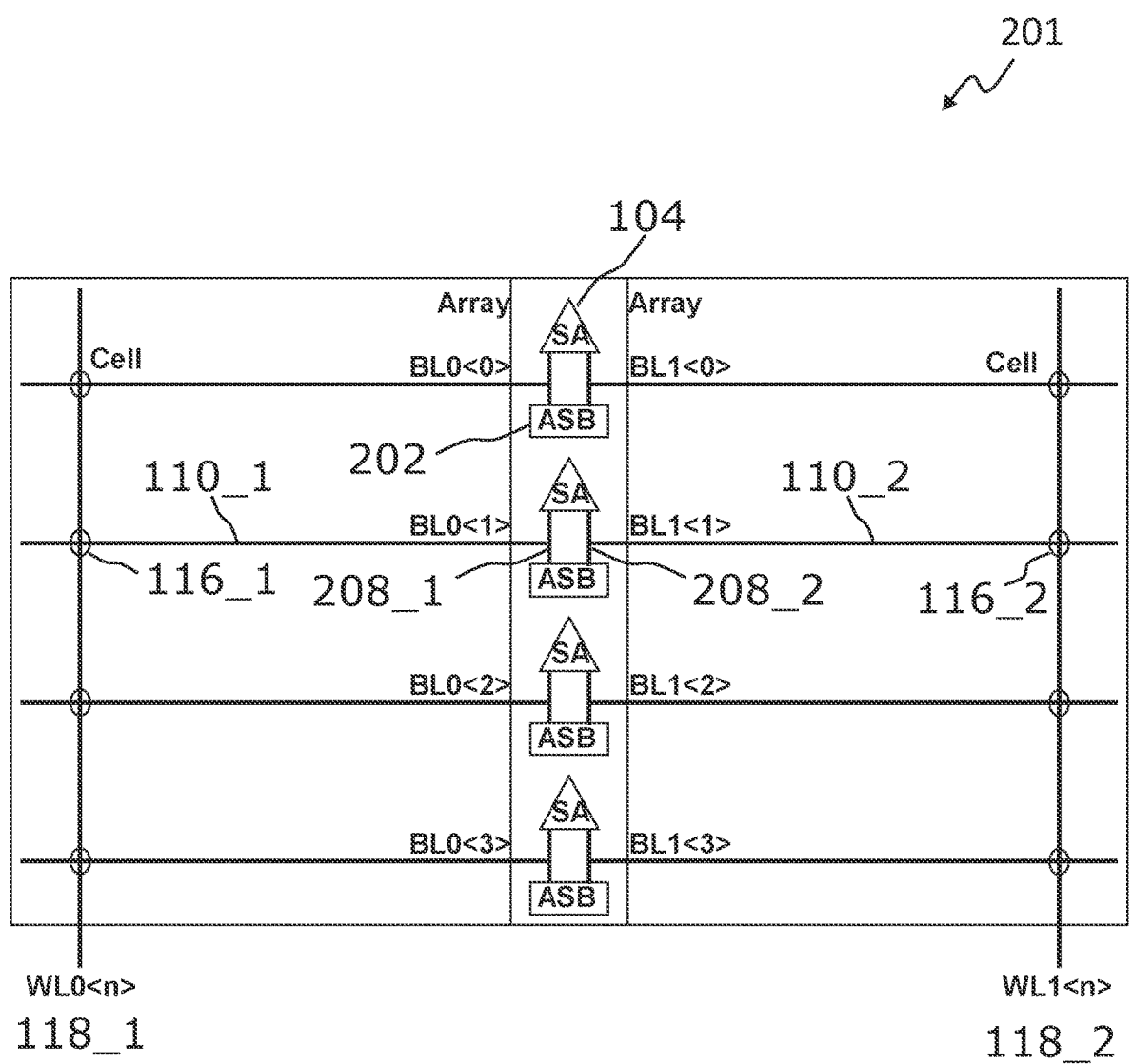
FIG. 2C and FIG. 2D each show a schematic representation of a non-volatile data memory according to various exemplary embodiments.
Figure 2D:
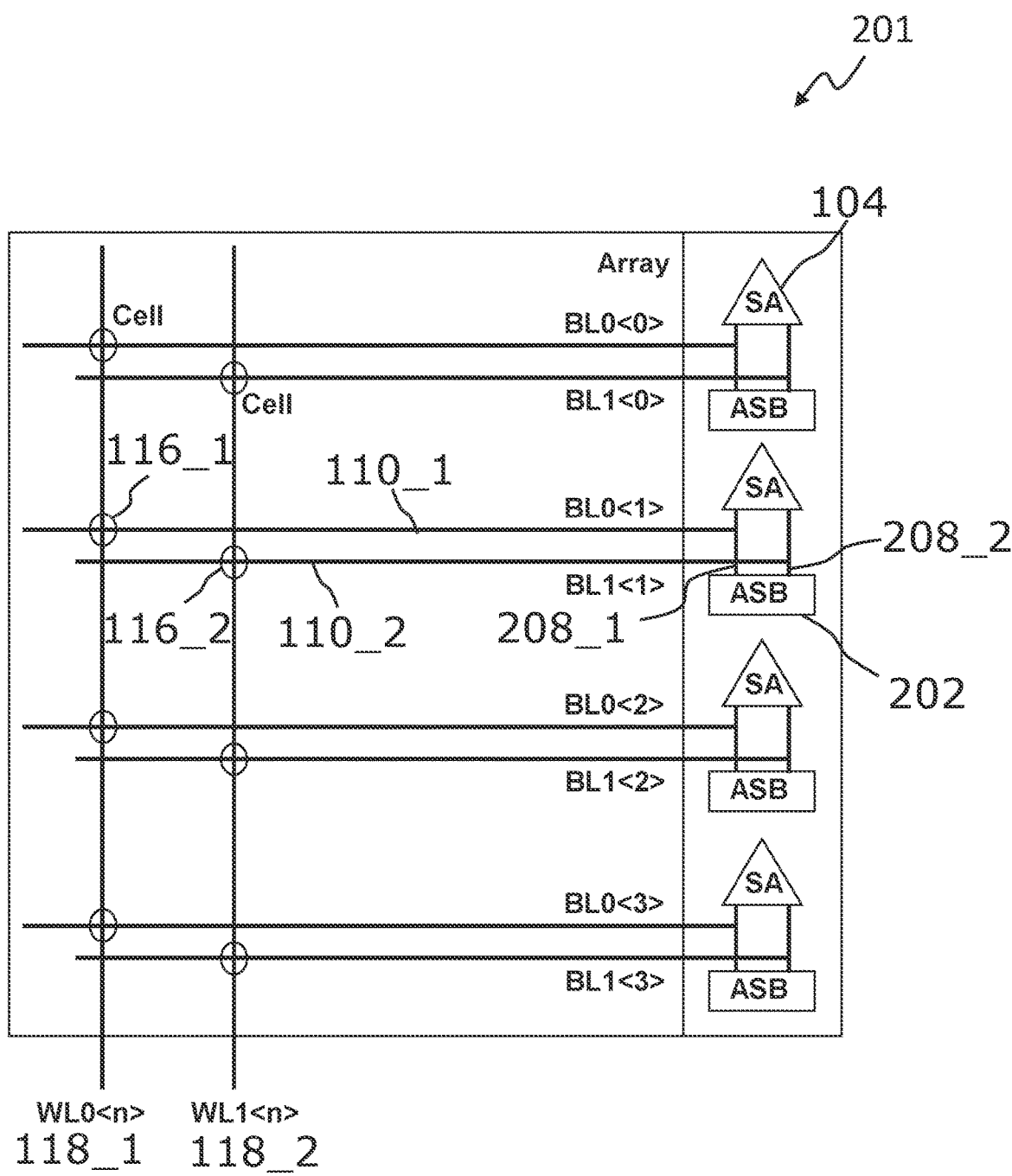

FIGS. 2A and 2B each show a schematic representation of a write circuit 200 according to different exemplary embodiments, and FIG. 2C and FIG. 2D each show a schematic representation of a non-volatile data memory 201 according to different exemplary embodiments.

In various exemplary embodiments, the write circuit 200 can comprise a buffer memory 202, in which at least one data value can be buffered before the data value is written to memory cells 116 of the non-volatile data memory 201. The buffer memory 202 is also known as a write buffer or an assembly buffer (ASB). The at least one data value can be provided to the buffer memory 202 using an input line 114.

Apart from the fact that, as described below, the buffer memory 202 has two output ports, to each of which the stored data value is provided or can be made available, it can essentially be formed as is known in the prior art. For example, the buffer memory 202 can have a latch 202b, a latch circuit 202c for filling the latch 202b, and a memory controller 202a for controlling the provision of the stored data values at the output ports.

For example, the write circuit 200 can also comprise a first write line 208_1 and a second write line 208_2.

FIG. 2A, FIG. 2C and FIG. 2D also show a sense amplifier 104 (SA), which is part of the non-volatile data memory 201 and is configured to evaluate a read signal between the two bit lines 110_1 and 110_2 and provide a digital output signal on an output line 122 according to the data values stored in the two memory cells 116_1 and 116_2. This applies to the differential reading case. In another case, not shown, only one of the stored data values, thus the value of the first memory cell 116_1 or the value of the second memory cell 116_2, would be compared with a reference value to provide the digital output signal on the output line 122. The sense amplifier 104 can be formed essentially as is known from the prior art.

The buffer memory 202 can have a first output and a second output. The first output is connected or can be connected to a first bit line 110_1 by means of a first write line 208_1. The first bit line 110_1 is or can be electrically conductively connected to a first memory cell 116_1. The second output is connected or can be connected to a second bit line 110_2 by means of a second write line 208_2. The second bit line 110_2 is or can be electrically connected to a second memory cell 116_2. The first bit line 110_1 and the second bit line 110_2 can be electrically insulated from each other.

In FIG. 2A and FIG. 2B, which show the write circuit 200, the memory cells 116 are not shown. FIG. 2C and FIG. 2D show exemplary designs for a non-volatile data memory 201, in which the bit lines 110 are connected to the memory cells 116, wherein, in particular, the geometric arrangement of the bit lines 110 and the memory cells 116 are different in the exemplary designs of FIG. 2C and FIG. 2D. In the design according to FIG. 2C the first bit line 110_1 with the first memory cell 116_1 connected to it and the second bit line 110_2 with the second memory cell 116_2 connected to it are arranged symmetrically with respect to the respective buffer memory 202 (and also with respect to a respective sense amplifier 104). On the other hand, in the design according to FIG. 2D the first bit line 110_1 with the first memory cell 116_1 connected to it and the second bit line 110_2 with the second memory cell 116_2 connected to it are arranged on the same side of the respective buffer memory 202 (or of the sense amplifier 104).

The memory cells 116 and their control, e.g. by means of the bit lines 110 and word lines 118, can be designed essentially as known in the prior art. For example, the write circuit 100 can be configured to select exactly one of the memory cells 116 connected to it for writing (or reading) for each bit line 220, because if more than one memory cell 116 was selected on the bit lines 110, the write current would be partitioned in an unpredictable way and proper programming would not be possible.

For example, the memory cells 116 can be arranged as (e.g. two) array blocks of memory cells 116 and connected to the bit lines 110. In various exemplary embodiments the writing operation itself, e.g. by means of a write current or a write voltage, can also be implemented essentially as known in the prior art.

In the exemplary embodiment of FIG. 2B, write information "1" or "0", in other words a data value, can be stored in the latch 202b. This can be set or reset by appropriate inputs, e.g. by means of the latch circuit 202c.

In various exemplary embodiments the write circuit 200 can be configured such that the buffer memory 202, e.g. the first output of the buffer memory 202, is connected or can be connected to the first memory cell 116_1 by means of the first write line 208_1 and at the same time connected to the second memory cell 116_2 by means of the second write line 208_2, for simultaneously or concurrently writing the data value stored in the buffer memory 202 to the first memory cell 116_1 and writing a second data value, dependent on the data value in a defined way, to the second memory cell 116_2.

In different exemplary embodiments, "dependent in a defined way" can mean that the second data value is complementary to the data value. This is also abbreviated to "complementary data value" or "complementary case".

In other exemplary embodiments, "dependent in a defined way" can mean that the second data value is identical to the data value. This is also abbreviated to "identical data value" or "identical case".

Both the complementary case and the identical case can be used in a test operating mode during testing of the non-volatile data memory 201. During a test of the data memory 201 it may be necessary to fill the memory cells 116 of the data memory 201 with defined data values as quickly as possible, for example by filling the memory cell arrays with strip-shaped or chessboard-pattern distributions of bit values (e.g. 0, 1). For this purpose it may be acceptable or desirable to fill two arrays with identical data values or patterns of data values, i.e. the identical case can be used. Alternatively, for the same memory cell arrays or for memory cell arrays of other exemplary embodiments of the non-volatile data memory 201, it may be acceptable or desirable to fill two arrays with complementary data values or patterns of data values, i.e. the complementary case can be used.

In various embodiments, an area (which may be contiguous) of e.g. several memory cells of a second array may be filled with the same data values as a first array. This may lead to a pattern in the form of stripes. At a different time, the area of e.g. several memory cells of the second array may be filled with data values complementary to the first array with leads to a checkerboard pattern.

However, applications for the complementary case and for the identical case may differ, at least in part.

For example, the complementary data value may be required for a non-volatile data memory 201 if the data memory 201 is configured for differential reading. This means that for the differential reading, both in the test mode and in a user mode, in other words during normal operation of the non-volatile data memory 201 for storing user data, the second data value is written to the second memory cell 116_2 as a data value complementary to the first data value.

In the identical case, however, which in the case of non-volatile data memories 201 that are configured to compare the memory value of one of the memory cells 116_1 or 116_2 with a reference value during the readout, the first memory cell 116_1 and the second memory cell 116_2 can both be filled with identical data values during a test mode. In a switching state that causes both outputs of the write buffer 202 to always supply the same write information, this means it is possible to write the same information to memory cells 116_1, 116_2 on the two bit lines 108_1, 108_2. This is an advantage for efficiently filling the memory 201 with test data, since it halves the time required to fill the memory 201.

During the user mode, the storage of two sets of identical data at the same time is useful only in case a redundant storage of data is desired.

In a typical case, coupling the second data value to make it identical to the data value is removed during a transition from a test mode to a user mode. The data memory 201 can then be configured to write data values that are both temporally and logically independent to the first memory cell 116_1 and to the second memory cell 116_2.

In order to effect the removable coupling of the second data value to the data value, the write circuit 200 can have a first switch 112_1 and a second switch 112_2. The first switch 112_1 can connect the first write line 208_1 to the first bit line 110_1, and the second switch 112_2 can connect the second write line 208_2 to the second bit line 110_2. For the coupling, i.e. for simultaneously writing the data value and the second data value which is dependent on it in a defined way, the first switch 112_1 and the second switch 112_2 can both be closed.

To remove the coupling, which can enable a temporally and logically independent writing to the first memory cell 116_1 and the second memory cell 116_2, only one of the switches 112_1, 112_2 can be closed at a time. For example, it may be possible to write an arbitrary data value to the first memory cell 116_1 if (only) the first switch 112_1 is closed, i.e. if there is a connection between the buffer memory 202 and the first memory cell 116_1. It may also be possible to write an arbitrary data value to the second memory cell 116_2 if only the second switch 112_2 is closed, i.e. if there is a connection between the buffer memory 202 and the second memory cell 116_2.

In various exemplary embodiments, a control circuit 220 can be provided as part of the write circuit 200. The control circuit 220 can be configured to establish or to disconnect the simultaneous connection of the buffer memory 202 to the first memory cell 116_1 and to the second memory cell 116_2.

Thus, in various exemplary embodiments, for example in the application examples described above (e.g., the non-volatile data memory 201 that reads out the data values by means of the reference value), the control circuit 220 can be configured to switch the write circuit 200 into a user operating mode and, during the user operating mode, to connect the buffer memory 202 to the first memory cell 116_1 using the first write line 108_1 in order to write the data value stored in the buffer memory 202 into the first memory cell 116_1, or to connect the buffer memory to the second memory cell 116_2 using the second write line 108_2, in order to write the data value stored in the buffer memory 202 to the second memory cell 116_2.

In various exemplary embodiments, the write circuit 200, e.g. as part of the control circuit, can comprise an inverter 220 between the second write line 208_2 and the second memory cell 116_2.

According to various exemplary embodiments, the inverter 220 can be switched between an active position, in which the inverter 220 is configured to provide the second data value as the complementary data value, and an inactive position in which the inverter 220 is configured to provide the second data value as the identical data value.

The inverter 220 can be used, as shown in FIG. 2B, as an EXNOR gate, which can override the inversion between the two output stages. (Of course, this can also be achieved e.g. by direct connection to the same output of the latch).

In various embodiments, the write circuit 200 ma be configured to be switched once or several times from the active position to the inactive position while filling the date memory 201, e.g. with test data.

In various embodiments, a plurality of first memory cells 116-1, which can be written by the first write line 208_1, may be filled with a set of predetermined data values in a test mode. A plurality of second memory cells 116-2, which can be written by the second write line 208_2, may be filled with a second set of predetermined data values. The second set may be identical to the first set by putting the inverter 220 in an inactive position during the write step. The second set may be complementary to the second set by putting the inverter 220 in an active position. The second set may be partly identical, partly complementary by switching between inactive and active position during the write step.

As the inverter 220 between the second write line 208_2 and the second write line 116_2 can be switched between the active and the passive positions, the write circuit 220 may be configured to write a first data word being stored in the buffer memory into the first memory cell 116_1 and at the same time, depending on the activity position of the inverter 220, data in the second memory cell 116_2. The activity position, being active or passive, may stay or change between a first write cycle and a second write cycle.

The inverter 220 may, as shown in FIG. 2B, implemented as a EXNOR-gate, which can remove the inversion between the two output stages. The EXNOR gate comprises a first input A that is connected with the node OVD3, while its input B is connected to the output of the buffer memory 202. When there is an high level at input A, that means a high voltage is present, the EXNOR-gate outputs a signal that is complementary to signal being present at input B. On the contrary, if a low level is at input A, the EXNOR-gate outputs a signal that is the same as the signal at the input A. In a further embodiment, not shown in FIG. 2B, the switches 112_1 and 112_2 can be switched off individually. In that embodiment the transistor P1 is controlled independently of transistor M10 in contrast to the embodiment of FIG. 2B. This enables to drive the connection lines 110_1 and 110_2 concurrently in test mode and individually in normal mode.

In FIG. 2B the exemplary write circuit 200 according to various exemplary embodiments is shown in detail. The latch 202b, which is used to store the write information, can have a first output and a second output. The first output (labeled "out_s") is connected to the first data line 208_1. The second output (labeled "out_s_n"), which forms an inverse output of the latch 202b or an output being identical to the output of latch 202b, is connected to the second data line 208_2.

FIG. 2C shows how the write circuit 200 can be embedded in a non-volatile data memory 201. The connection line 110_1 is a bitline named BL0<1>, which will be connected to the cell 116_1, if the wordline 118_1 is at a high voltage level. The connection line 110_2 is a bitline named BL1<1>, which will be connected to the cell 116_2 if the wordline 118_2 is at a high voltage level. In test mode and write mode, these two wordlines may be switched concurrently to a high voltage level to enable concurrent writing to cells 116_1 and 116_2. In normal mode and during read in normal mode, not more than one of these wordlines may be at a high voltage level at a given time.

One example is characterized by a test mode, a write cycle and the inverter 220 being in inverting mode. In this example, if the latch 202b is in state "1", the data value 1 is written to the first memory cell 116_1 at the first output "gbl_asb0" 110_1, the data value "0" is written in cell 116_2 through the second output "gbl_asb1" 110_2. If a "0" is stored in the latch 202b, the data value "1" would accordingly be written to the second memory cell 116_3 at the output "gbl_asb1", and the data value "0" would be written to the first memory cell 116_1 at output "gbl_asb0".

Figure 3:
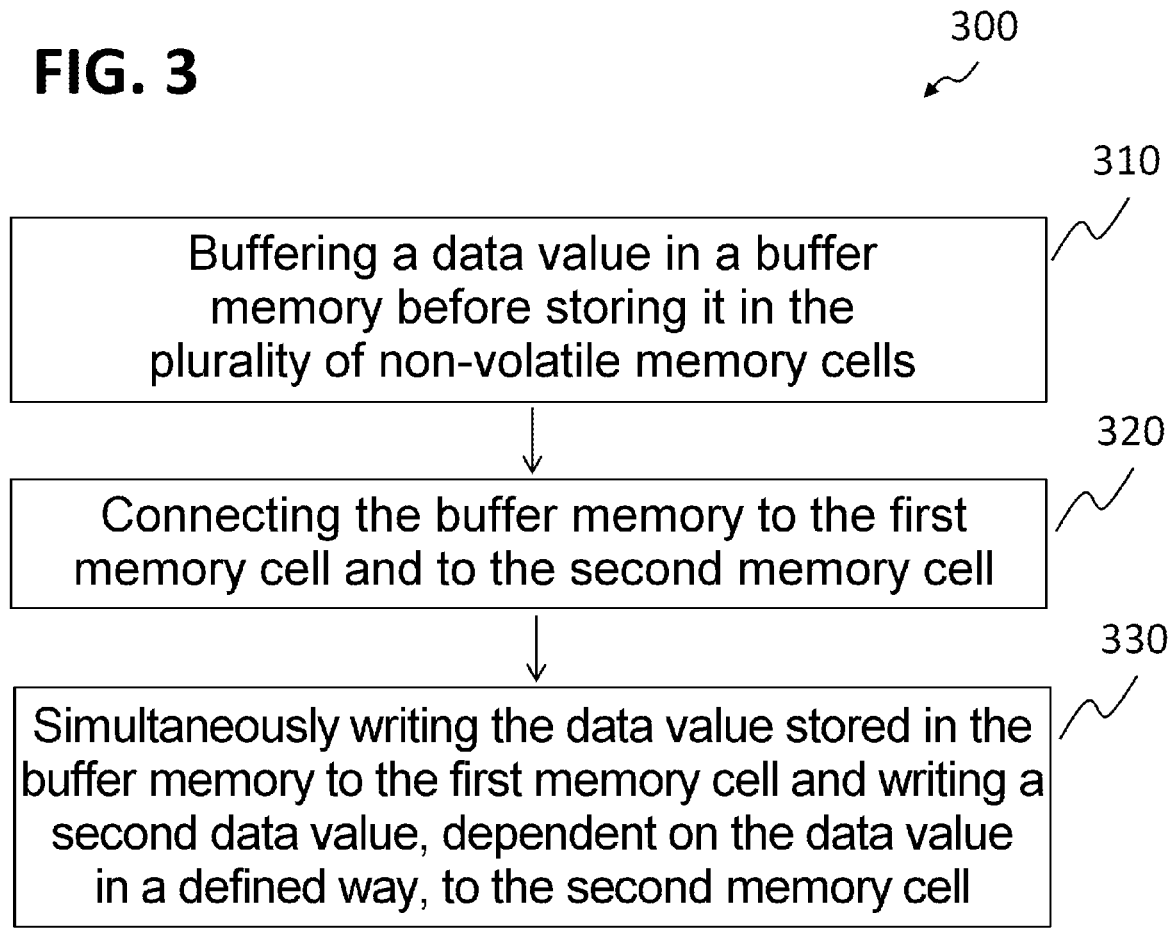
FIG. 3 shows a flowchart of a method for writing to a plurality of memory cells according to various exemplary embodiments, and FIG. 4 and FIG. 5 each show a flowchart of a method for operating a non-volatile data memory.

FIG. 3 shows a flowchart 300 of a method for writing to a plurality of memory cells of a non-volatile data memory according to various exemplary embodiments. For example, the non-volatile data memory can be one of the non-volatile data memories 201 described above, according to various exemplary embodiments.

The method can comprise buffering a data value in a buffer memory before storing the value in the plurality of non-volatile memory cells (at 310).

The method can also comprise connecting the buffer memory to the first memory cell and to the second memory cell (at 320).

The method can also comprise simultaneously or concurrently writing the data value stored in the buffer memory to the first memory cell and writing a second data value, dependent on the data value in a defined way, to the second memory cell (at 330).

The dependent second data value can be complementary to the first data value in various exemplary embodiments. In other exemplary embodiments, the dependent second value can be identical to the first data value.

FIG. 4 and FIG. 5 show a flowchart 400 and 500 respectively of a method for operating a non-volatile data memory.

The method according to FIG. 4 can comprise buffering a data value in a buffer memory before storing the value in the plurality of non-volatile memory cells (at 410), connecting the buffer memory to the first memory cell and to the second memory cell (at 420), simultaneously or concurrently writing the data value stored in the buffer memory to the first memory cell and a second data value, dependent on the data value in a defined way, to the second memory cell (at 430), and determining an output value based on the data value written to the first memory cell and on the data value written to the second memory cell (at 440). Here, the second data value can be complementary to the data value.

The method according to FIG. 5 can comprise buffering a data value in a buffer memory before storing the value in the plurality of non-volatile memory cells (at 510), connecting the buffer memory to the first memory cell and to the second memory cell (at 520), simultaneously or concurrently writing the data value stored in the buffer memory to the first memory cell and a second data value, dependent on the data value in a defined way, to the second memory cell (at 530), and determining an output value based either on the data value written to the first memory cell or on the data value written to the second memory cell (at 540). The second data value can be identical or complementary to the first data value.

Several exemplary embodiments are described below.

Exemplary embodiment 1 is a write circuit for writing to a plurality of memory cells of a non-volatile data memory. The write circuit may comprise a buffer memory that is configured to buffer a data value before storing it in the plurality of non-volatile memory cells of the non-volatile data memory, a first write line by means of which the buffer memory can be connected to a first memory cell of the plurality of memory cells, a second write line, which is different from the first write line and by means of which the buffer memory can be connected to a second memory cell of the plurality of memory cells, wherein the buffer memory is or can be connected to the first memory cell by means of the first write line and at the same time to the second memory cell by means of the second write line for simultaneously writing the data value stored in the buffer memory to the first memory cell and a second data value, dependent on the data value in a defined way, to the second memory cell.

Exemplary embodiment 2 is a write circuit according to exemplary embodiment 1, wherein the second data value is complementary to the data value.

Exemplary embodiment 3 is a write circuit according to exemplary embodiment 1 or 2, which further comprises a control circuit configured to establish or disconnect the simultaneous connection of the buffer memory to the first memory cell and to the second memory cell.

Exemplary embodiment 4 is a write circuit according to exemplary embodiment 3, wherein the control circuit has an inverter between the second write line and the second memory cell.

Example 5 is a write circuit according to exemplary embodiment 4, wherein the inverter can be switched between an active position, in which the inverter is configured to provide the second data value as the complementary data value, and an inactive position in which the inverter is configured to provide the second data value as the identical data value, or vice versa.

Exemplary embodiment 6 is a write circuit according to exemplary embodiment 1, wherein the second data value is identical to the data value.

Exemplary embodiment 7 is a write circuit according to one of the exemplary embodiments 1 to 5, wherein the simultaneous writing to the first memory cell and to the second memory cell forms a test operating mode for use when testing the data memory.

Exemplary embodiment 8 is a write circuit according to exemplary embodiment 6 or 7, wherein the control circuit is further configured to switch the write circuit into a user operating mode and during the user operating mode to connect the buffer memory to the first memory cell using the first write line in order to write the data value stored in the buffer memory into the first memory cell, or to connect the buffer memory to the second memory cell using the second write line in order to write the data value stored in the buffer memory to the second memory cell.

Exemplary embodiment 9 is a non-volatile data memory. The non-volatile data memory comprises a plurality of memory cells, at least one write circuit according to one of the exemplary embodiments 1 to 4 and at least one sense amplifier, which is connected to the first memory cell and to the second memory cell and is configured to determine an output value based on the data value written to the first memory cell and on the data value written to the second memory cell.

Exemplary embodiment 10 is a non-volatile data memory. The non-volatile data memory comprises a plurality of memory cells, at least one write circuit according to one of the exemplary embodiments 1 or 6 to 8, and at least one sense amplifier, which is connected to the first memory cell and to the second memory cell and is configured to determine an output value based either on the data value written to the first memory cell or on the data value written to the second memory cell.

Exemplary embodiment 11 is a method for writing to a plurality of memory cells of a non-volatile data memory. The method comprises buffering a data value in a buffer memory before storing said value in the plurality of non-volatile memory cells, connecting the buffer memory to the first memory cell and to the second memory cell, and simultaneously writing the data value stored in the buffer memory to the first memory cell and writing a second data value, dependent on the data value in a defined way, to the second memory cell.

Exemplary embodiment 12 is a method according to exemplary embodiment 10, wherein the second data value is complementary to the data value.

Example 13 is a method according to exemplary embodiment 11 or 12, which further comprises inverting the stored data value to form the second data value.

Exemplary embodiment 14 is a method according to exemplary embodiment 11, wherein the second data value is identical to the data value.

Exemplary embodiment 15 is a method according to exemplary embodiment 14, wherein the simultaneous writing to the first memory cell and to the second memory cell forms a test operating mode for use when testing the data memory.

Exemplary embodiment 16 is a method according to exemplary embodiment 15, further comprising switching the write circuit into a user operating mode and during the user operating mode, connecting the buffer memory to the first memory cell and writing the data value stored in the buffer memory to the first memory cell, or connecting the buffer memory to the second memory cell and writing the data value stored in the buffer memory to the second memory cell.

Exemplary embodiment 17 is a method for operating a non-volatile data memory that comprises a plurality of memory cells. The method comprises writing to a plurality of the memory cells of the non-volatile data memory by means of a method according to one of the exemplary embodiments 11 to 13 and determining an output value based on the data value written to the first memory cell and the data value written to the second memory cell.

Exemplary embodiment 18 is a method for operating a non-volatile data memory that comprises a plurality of memory cells. The method comprises writing to a plurality of the memory cells of the non-volatile data memory by means of a method according to any of the exemplary embodiments 11 or 14 to 16, and determining an output value based either on the data value written to the first memory cell or on the data value written to the second memory cell.

Some of the exemplary embodiments are described in connection with devices, and some of the exemplary embodiments are described in connection with methods. Additional advantageous configurations of the method are obtained from the description of the device, and vice versa.

The invention claimed is:

1. A write circuit for writing to a plurality of memory cells of a non-volatile data memory, comprising:
    a buffer memory forming a single memory element which is configured to buffer solely a single value at a time, a first data value, before storing said first data value in the plurality of non-volatile memory cells of the non-volatile data memory;
    a first write line, by means of which the buffer memory is connected to a first memory cell of the plurality of memory cells;
    a second write line, which is different from the first write line and by which the buffer memory is connected to a second memory cell of the plurality of memory cells;
    a control circuit configured to concurrently write the first data value in the first memory cell and a second data value which depends on the first data value into the second memory cell, wherein the second data value is complementary to the first data value or is identical to the first data value depending on a selected one of a first option or a second option by the control circuit, respectively.

2. The write circuit as claimed in claim 1, wherein the control circuit is configured to selectively establish or to disconnect a concurrent connection of the buffer memory to the first memory cell and to the second memory cell.

3. The write circuit as claimed in claim 2,
    wherein the control circuit comprises an EXNOR gate coupled between the second write line and the second memory cell.

4. The write circuit as claimed in claim 1,
    wherein a concurrent writing to the first memory cell and to the second memory cell forms a test operating mode for use when testing the non-volatile data memory.

5. The write circuit as claimed in claim 4,
wherein the control circuit is also configured to switch the write circuit into a user operating mode and, during the user operating mode, to either connect the buffer memory to the first memory cell using the first write line in order to write a data value stored in the buffer memory into the first memory cell or to connect the buffer memory to the second memory cell using the second write line in order to write the data value stored in the buffer memory to the second memory cell.

6. A non-volatile data memory, comprising:
a plurality of memory cells;
at least one write circuit, comprising:
  a buffer memory forming a single memory element which is configured to buffer solely a single value at a time, a first data value, before storing said first data value in the plurality of non-volatile memory cells of the non-volatile data memory;
  a first write line, by means of which the buffer memory is connected to a first memory cell of the plurality of memory cells;
  a second write line, which is different from the first write line and by means of which the buffer memory is connected to a second memory cell of the plurality of memory cells;
  a control circuit configured to concurrently write the first data value in the first memory cell and a second data value which depends on the first data value into the second memory cell, wherein the second data value is complementary to the first data value or is identical to the first data value depending on a selected one of a first option or a second option by the control circuit, respectively;
  at least one sense amplifier, which is connected to the first memory cell and to the second memory cell and is configured to determine an output value based on either the data value written to the first memory cell or on the data value written to the second memory cell.

7. The write circuit as claimed in claim 6, wherein the control circuit is configured to selectively establish or to disconnect the concurrent connection of the buffer memory to the first memory cell and to the second memory cell.

8. The write circuit as claimed in claim 7,
wherein the control circuit comprises an EXNOR gate coupled between the second write line and the second memory cell.

9. The write circuit as claimed in claim 6,
wherein the concurrent writing to the first memory cell and to the second memory cell forms a test operating mode for use when testing the data memory.

10. The write circuit as claimed in claim 9,
wherein the control circuit is also configured to switch the write circuit into a user operating mode and, during the user operating mode, to either connect the buffer memory to the first memory cell using the first write line in order to write the data value stored in the buffer memory into the first memory cell or to connect the buffer memory to the second memory cell using the second write line in order to write the data value stored in the buffer memory to the second memory cell.

11. A method for writing to a plurality of memory cells of a non-volatile data memory, comprising:
  buffering a first data value in a buffer memory forming a single memory element before storing solely a single value at a time, the first data value, in the plurality of non-volatile memory cells;
  connecting the buffer memory to a first memory cell and to a second memory cell of the plurality of memory cells; and
  concurrently writing the data value stored in the buffer memory to the first memory cell and a second data value, dependent on the first data value in a defined way, to the second memory cell, wherein in a first selected option the second data value is a complementary to the first data value, and in a second selected option the second data value is identical to the first data value.

12. The method as claimed in claim 11,
wherein the concurrent writing to the first memory cell and to the second memory cell forms a test operating mode of a write circuit for use when testing the data memory.

13. The method as claimed in claim 12, further comprising:
  switching the write circuit into a user operating mode; and
  during the user operating mode:
    connecting the buffer memory to the first memory cell and writing the data value stored in the buffer memory to the first memory cell; or
    connecting the buffer memory to the second memory cell and writing the data value stored in the buffer memory to the second memory cell.

* * * * *